(12) United States Patent
Frank et al.

(10) Patent No.: US 6,448,781 B1
(45) Date of Patent: Sep. 10, 2002

(54) METHOD AND SYSTEM FOR ANALYZING CABLE FAULTS

(75) Inventors: Marguerite A. Frank, Fort Salonga; Stanley Teich, Melville, both of NY (US)

(73) Assignee: Northrop Grumman Corporation, Los Angeles, CA (US)

( * ) Notice: Subject to any disclaimer, the term of this patent is extended or adjusted under 35 U.S.C. 154(b) by 22 days.

(21) Appl. No.: 09/684,235

(22) Filed: Oct. 6, 2000

(51) Int. Cl.$^7$ .............................................. G01R 31/11
(52) U.S. Cl. ...................................................... 324/533
(58) Field of Search ................................. 324/533, 522, 324/529, 520, 76.11

(56) References Cited

U.S. PATENT DOCUMENTS

| | | | |
|---|---|---|---|
| 4,110,684 A | * 8/1978 | Gale | 324/522 |
| 4,491,782 A | * 1/1985 | Bellis et al. | 324/533 |
| 4,970,466 A | 11/1990 | Bolles et al. | 324/533 |
| 5,128,619 A | 7/1992 | Bjork et al. | 324/533 |
| 5,231,987 A | 8/1993 | Robson | 607/29 |
| 5,233,986 A | 8/1993 | Robson | 607/4 |
| 5,373,356 A | 12/1994 | Anderson | 356/73.1 |
| 5,461,318 A | 10/1995 | Borchert et al. | 324/533 |
| 5,479,610 A | 12/1995 | Roll-Mecak et al. | 395/183 |
| 5,608,328 A | * 3/1997 | Sanderson | 324/529 |
| 5,650,728 A | 7/1997 | Rhein et al. | 324/543 |
| 5,699,402 A | 12/1997 | Bauer et al. | 379/26 |
| 5,751,766 A | 5/1998 | Kletsky et al. | 375/224 |
| 5,870,451 A | 2/1999 | Winkler et al. | 379/26 |
| 6,242,900 B1 | * 6/2001 | Fawcett et al. | 324/520 |

FOREIGN PATENT DOCUMENTS

WO   WO 95/12820   5/1995   ........... G01R/31/28

* cited by examiner

Primary Examiner—Michael J. Sherry
Assistant Examiner—Anand Amin
(74) Attorney, Agent, or Firm—Baker Botts L.L.P.

(57) ABSTRACT

A method for analyzing cable faults includes dividing a waveform into a plurality of segments. The waveform is representative of a reflected signal created by applying a stimulus signal to a cable, and the slope at any point on each respective segment of the waveform falls within a respective specified range. The method further includes determining a longest segment from the plurality of segments, and identifying a predicted location of the fault based, at least in part, on the location of the longest segment.

34 Claims, 4 Drawing Sheets

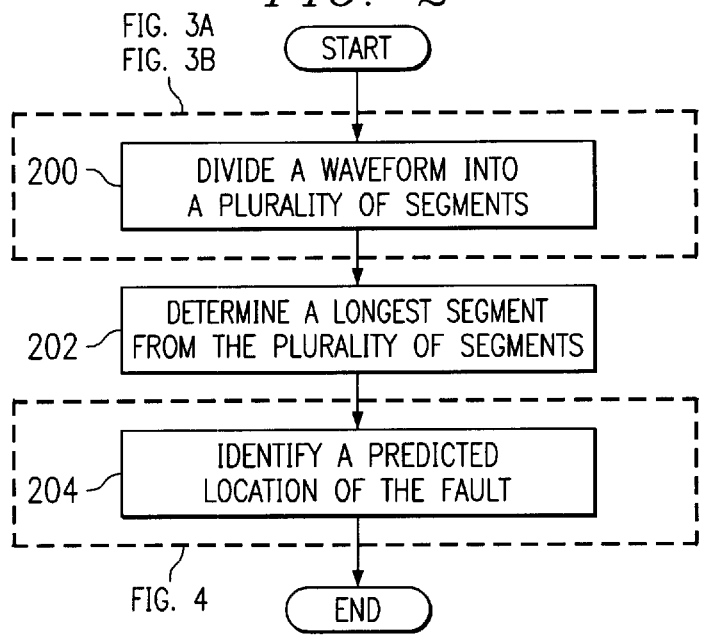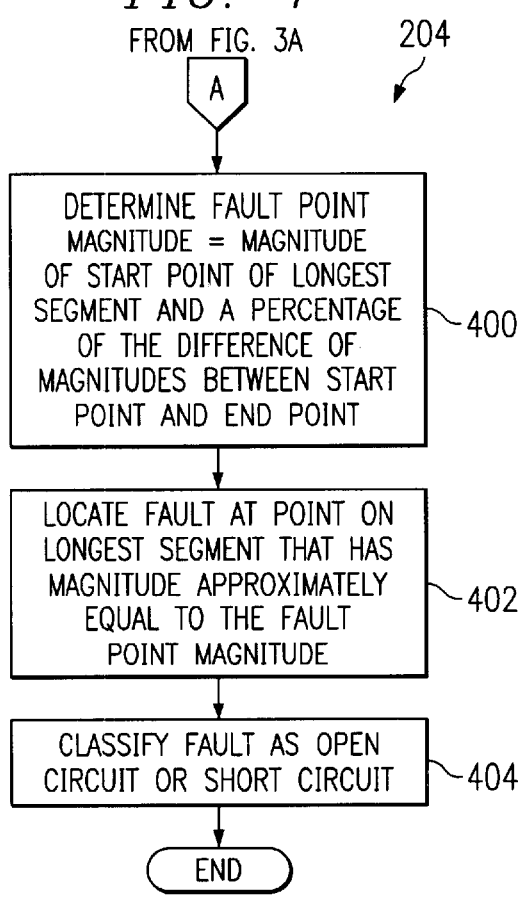

METHOD AND SYSTEM FOR ANALYZING CABLE FAULTS

TECHNICAL FIELD OF THE INVENTION

This invention relates generally to the field of fault detection and, more specifically, to a method and system for analyzing cable faults.

BACKGROUND OF THE INVENTION

Faults in cables, such as open circuits and short circuits, frequently occur. The maintenance and repair of such faults may be difficult, time-consuming, and expensive, depending on the placement of the cable and the location of the fault. For example, a fault may occur in a cable inside an aircraft wing in which the cable controls an aileron. Disassembling the wing to locate and fix the fault is very time-consuming and expensive. Maintenance personnel need and desire easy and efficient ways to locate cable faults so that time and cost is reduced.

One way of detecting and locating a cable fault is to utilize a Time Domain Reflectometer ("TDR"). A TDR typically sends a stimulus signal down a cable under test and receives back a reflection signal, which can be displayed as a waveform. The reflected signal is a signal that is indicative of a fault in the cable. Classification and location of the fault is then undertaken by analyzing the waveform returned. This is presently done by a user that visually inspects and analyzes the waveform. This visual inspection and analysis requires time and a certain level of expertise on the part of a user. This visual inspection and analysis also results in inconsistent conclusions because of noise encountered during the testing of the cable. The time spent, expertise required, and inconsistent conclusions results in wasted time and money.

SUMMARY OF THE INVENTION

The challenges in the field of fault detection continue to increase with demands for more and better techniques having greater flexibility and adaptability. Therefore, a need has arisen for a new method and system for analyzing cable faults.

In accordance with the present invention, a method and system for analyzing cable faults is provided that addresses disadvantages and problems associated with previously developed systems and methods.

According to one embodiment of the invention, a method for analyzing cable faults includes dividing a waveform into a plurality of segments. The waveform is representative of a reflected signal created by applying a stimulus signal to a cable, and the slope at any point on each respective segment of the waveform falls within a respective specified range. The method further includes determining a longest segment from the plurality of segments, and identifying a predicted location of the fault based, at least in part, on the location of the longest segment.

Embodiments of the invention provide numerous technical advantages. For example, a technical advantage of one embodiment of the present invention is time and money are saved by eliminating the need for a human being to inspect and analyze a waveform obtained by a Time Domain Reflectometer ("TDR"). Another technical advantage of one embodiment of the present invention is that inconsistent conclusions are eliminated because of different levels of expertise utilized in inspecting and analyzing waveforms. An additional technical advantage of one embodiment of the present invention is that inconsistent conclusions are eliminated because the present invention automatically accounts for any noise encountered in the testing.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which:

FIG. 2 is a flowchart demonstrating one method for analyzing cable faults in accordance with one embodiment of the present invention;

FIG. 4 is a flowchart demonstrating one method for locating a cable fault in accordance with one embodiment of the present invention.

DETAILED DESCRIPTION OF EMBODIMENTS OF THE INVENTION

Embodiments of the present invention and their advantages are best understood by referring now to FIGS. 1A through 4 of the drawings, in which like numerals refer to like parts.

Figure 1A:
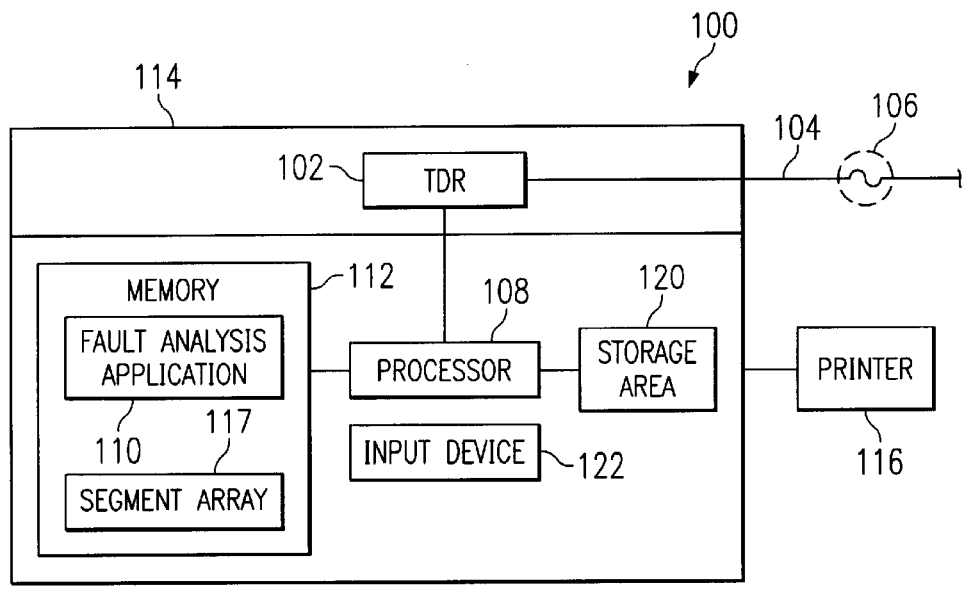
FIG. 1A is a schematic diagram illustrating a system for analyzing cable faults in accordance with one embodiment of the present invention.

FIG. 1A is a schematic diagram illustrating a system 100 for analyzing cable faults in accordance with one embodiment of the present invention. In one embodiment, system 100 includes a computer 114 having a time domain reflectometer ("TDR") 102 coupled to a cable 104 for the purpose of detecting, locating, and/or classifying a fault 106 in cable 104. For example, fault 106 may occur in cable 104 inside an aircraft wing. Disassembling the wing to locate and fix fault 106 is very time consuming and expensive. The present invention addresses these problems by providing computer 114 with TDR 102 to automatically analyze a waveform 118 (FIG. 1B) obtained by TDR 102 that is representative of fault 106 in cable 104. System 100 may also include a printer 116 coupled to computer 114.

Computer 114 may be any suitable type of computer operable to analyze waveform 118 by having a processor 108 that is operable to execute a fault analysis application 110 stored in a memory 112. Computer 114 may also include other elements, such as a storage area 120 and an input device 122. Processor 108 may comprise any suitable type of processing unit that executes logic. One of the functions of processor 108 is to receive data representing waveform 118 from TDR 102 and to store this data in either memory 112 or storage area 120. Another function of processor 108 is to utilize fault analysis application 110 to analyze waveform 118 for the purpose of locating and/or classifying fault 106 in cable 104.

Fault analysis application 110 is a computer program written in any suitable computer language that is operable to analyze waveform 118 for the purpose of locating and/or classifying fault 106 in cable 104. Methods performed by particular embodiments of fault analysis application 110 are described in greater detail below in conjunction with FIGS. 2 through 4. Alternatively, fault analysis application 110 may take other forms, such as an application specific integrated circuit, which do not utilize software.

Memory 112 and storage area 120 may comprise a file, a stack, a database, or any other suitable organization of volatile or non-volatile memory. Memory 112 and storage area 120 may be random access memory, read-only memory, CD-ROM, removable memory devices, or any other suitable devices that allow storage or retrieval of data. Memory 112 and storage area 120 are interchangeable and may perform the same functions.

Input device 122 may be coupled to computer 114 for the purpose of directing fault analysis application 110 to analyze waveform 118. In one embodiment, input device 122 is a mouse; however, input device 122 may take other forms, such as a keyboard or a stylus.

TDR's are well-known in the art of fault detection. In the present invention, TDR 102 is operable to apply a stimulus signal through cable 104, to receive a reflected signal that is indicative of the impedance of cable 104 at any given point on cable 104, and to obtain waveform 118 (FIG. 1B) characterized by data that is representative of the reflected signal. Waveform 118 may then be analyzed so that fault 106 can be located and/or classified. In one embodiment of the present invention, time and money are saved by eliminating the need for a human being to inspect and analyze waveform 118 obtained by TDR 102, and inconsistent conclusions, resulting from varying levels of expertise utilized in inspecting and analyzing waveforms, are eliminated. These advantages are realized by the present invention by utilizing fault analysis application 110 to automatically analyze waveform 118 for the purpose of locating and/or classifying fault 106 in cable 104. Such analysis is described in greater detail below in conjunction with FIGS. 2 through 4.

Cable 104 may be any suitable type of cable for which testing is desired, such as radio frequency coaxial, twisted pair, and single conductor. Fault 106 may be any type of fault, such as an open circuit or a short circuit.

Printer 116 may be any suitable type of printer used to print out various information, such as the output of TDR 102 and the results of executing fault analysis application 110 on waveform 118.

Figure 1B:
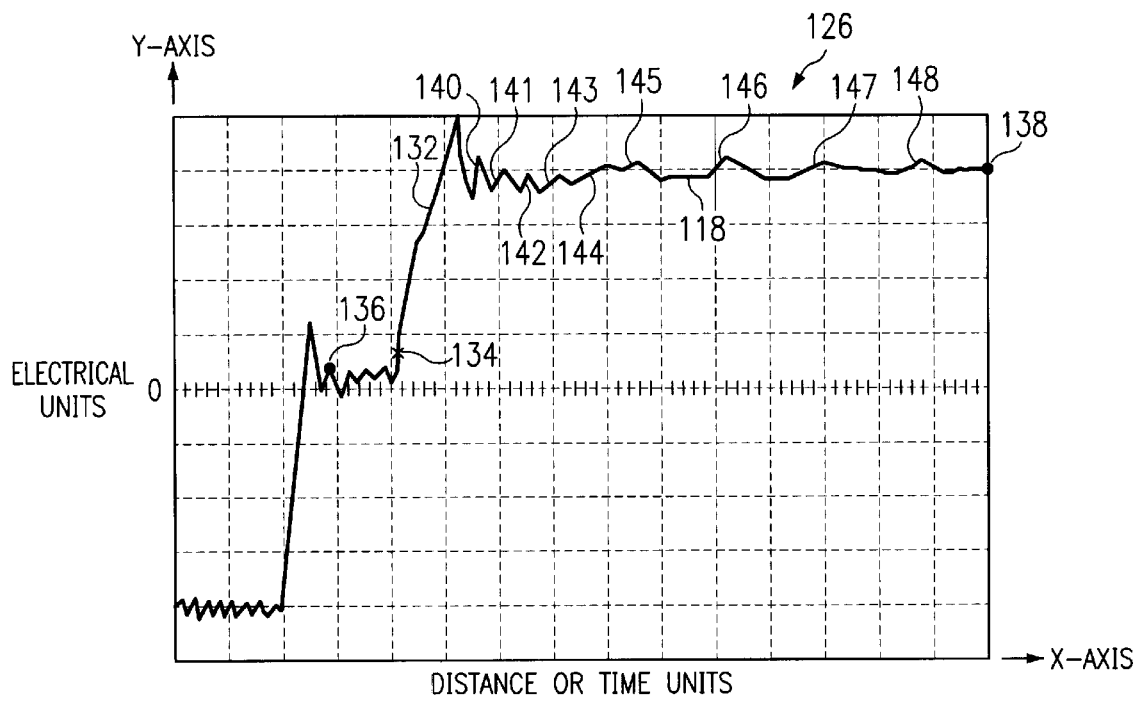
FIG. 1B is a diagram of a waveform produced by the system of FIG. 1A, superimposed on a coordinate system, to be analyzed in accordance with one embodiment of the resent invention.

FIG. 1B illustrates waveform 118 superimposed on a coordinate system 126. As mentioned previously, waveform 118 is the output of TDR 102. Waveform 118 has corresponding waveform data characterized by a plurality of coordinate points representative of the magnitude of the reflected signal and the location within cable 104. These coordinate points may be X-axis values and Y-axis values as shown in FIG. 1B. Waveform 118 may be suitably displayed on a cathode-ray tube ("CRT") or a liquid crystal display ("LCD") on either computer 114 or TDR 102 if TDR 102 is external to computer 114.

X-axis values may be in units such as distance or time units, and Y-axis values may be in units such as electrical units. As examples, X-axis values may be in feet, meters, or nanoseconds, and Y-axis values may be in millivolts, ohms, or rhos. Every point on waveform 118 is characterized by coordinate points, and some of those coordinate points, with their respective X-axis values and Y-axis values, are utilized by fault analysis application 110 to determine the location and/or classification of fault 106 in cable 104.

FIG. 1B also shows waveform 118 having a reference point 136, a marker 134, and a longest segment 132, and example segments 140–148. These elements are discussed more fully below in conjunction with FIGS. 2 through 4.

For clarity of description, the methods discussed below in conjunction with FIGS. 2 through 4 analyze waveform 118 from right-to-left. For example, referring to FIG. 1B, an analysis starts at a point 138 on waveform 118 having the maximum X-axis value and proceeds "backward" towards the Y-axis. A person skilled in the art, however, can appreciate that an analysis of waveform 118 may be undertaken in the "forward" direction.

FIG. 2 is a flowchart demonstrating one method for analyzing cable faults in accordance with one embodiment of the present invention. In general, and as described in greater detail below, the method of FIG. 2 locates fault 106 by identifying a portion of waveform 118 that has the largest change in magnitude. Details of one embodiment of locating the portion of waveform 118 that has the largest change in magnitude is described below in conjunction with FIGS. 2 through 4. In addition, the exact location of fault 106 within the identified portion is determined as described below with reference to these figures.

Waveform 118 is divided into a plurality of segments at step 200. In one embodiment, these segments have start points and end points characterized by X-axis values and Y-axis values. Example segments 140, 141, 142, 143, 144, 145, 146, 147, and 148, having respective start points and end points, are illustrated in FIG. 1B. As mentioned previously, waveform 118 is representative of a reflected signal created by applying a stimulus signal to cable 104 by TDR 102. Each segment is a set of adjacent points on waveform 118 that generally fall within a specified range. In one embodiment, the slope at any point on each segment has a positive sign, while in another embodiment, the slope at any point on each segment has a negative sign. Since fault detection oftentimes involves the occurrence of noise in the reflected signal, a tolerable number of adjacent points on waveform 118 that have an opposite sign slope within each segment is accepted. In one embodiment of the present invention, inconsistent conclusions, resulting from varying levels of expertise utilized in inspecting and analyzing waveforms, are eliminated because fault analysis application 110 automatically accounts for any noise encountered in the testing. Additional details of step 200 are described below in conjunction with the description of FIGS. 3A and 3B.

Longest segment 132 (FIG. 1B) is determined from the plurality of segments, at step 202. In one embodiment, longest segment 132 is defined as a segment having the largest change in magnitude of Y-axis values between the start point and end point of each segment. A predicted location of fault 106, based at least in part on the location of longest segment 132, may then be identified at step 204, thereby ending the method. In one embodiment, the location of fault 106 is predicted to be near the start point of longest segment 132; however, the location of fault 106 may be predicted to exist at other locations on longest segment 132. In one embodiment, marker 134 is placed at the predicted location of fault 106 by fault analysis application 110. Additional details of step 204 are described below in conjunction with the description of FIG. 4.

Figure 3A:
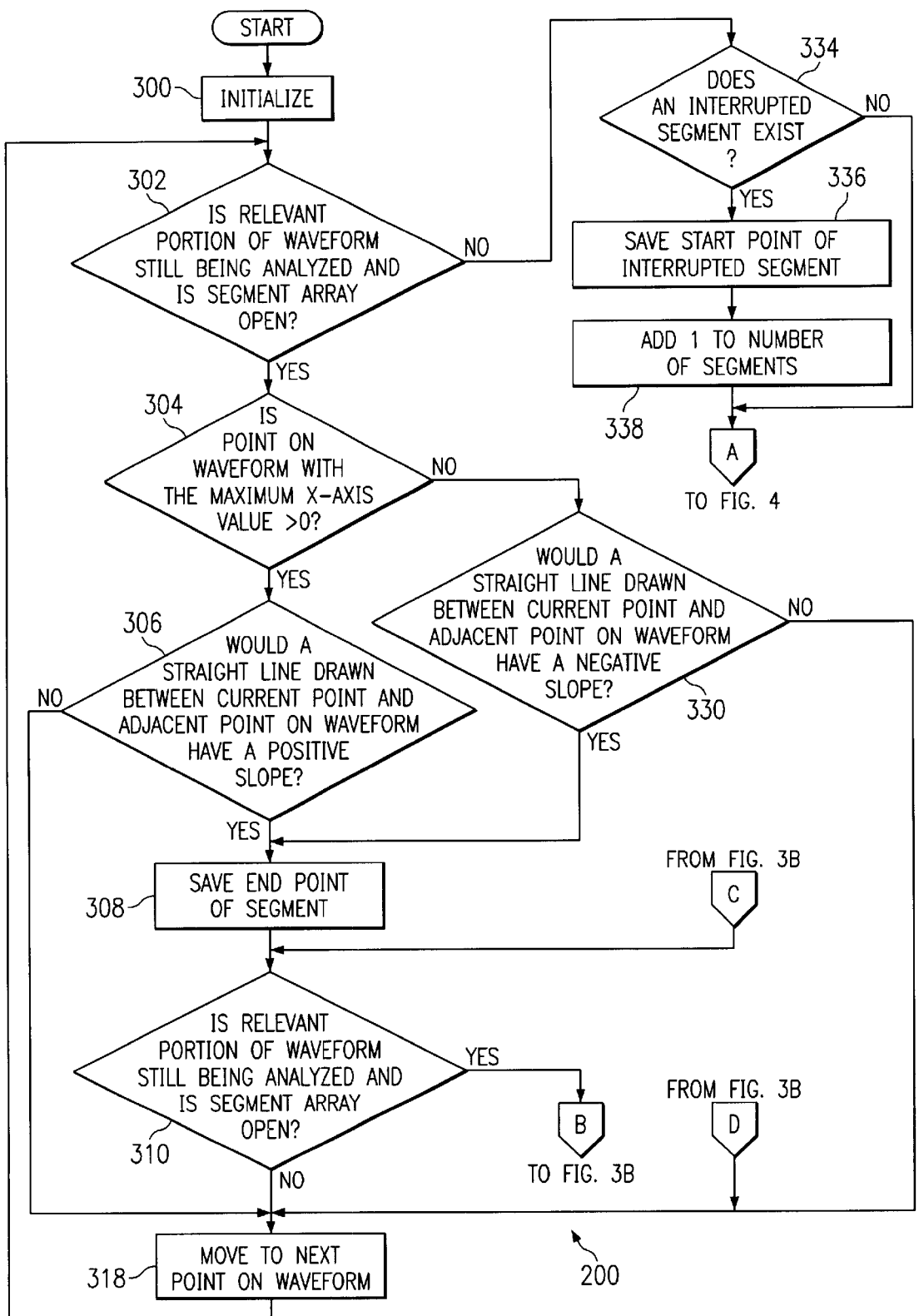
FIGS. 3A and 3B are flowcharts demonstrating one method for dividing a waveform into segments for use in analyzing cable faults in accordance with one embodiment of the resent invention.
Figure 3B:
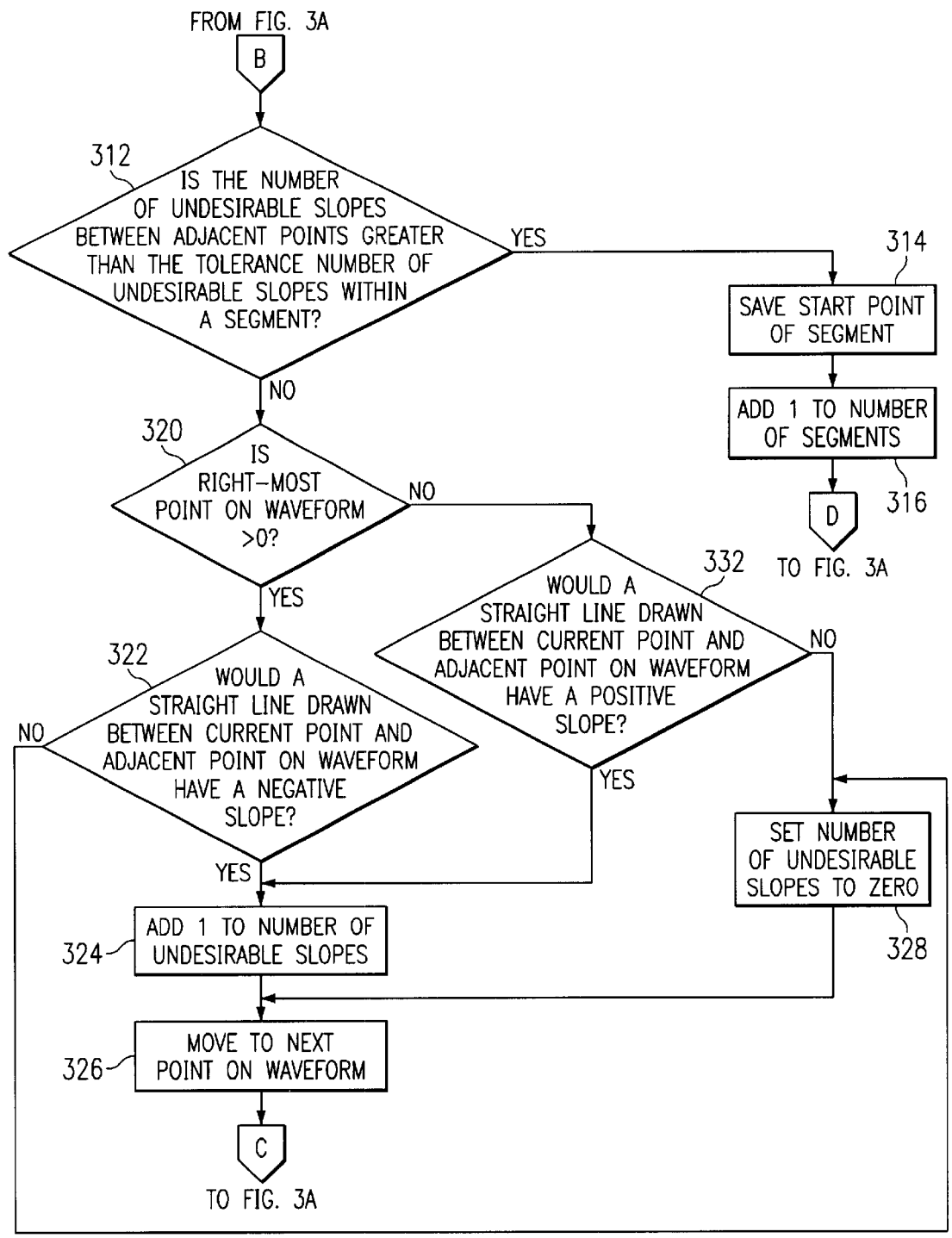

FIGS. 3A and 3B are flowcharts demonstrating additional details of step 200 for dividing waveform 118 into segments for use in analyzing cable faults in accordance with one embodiment of the present invention. Dividing waveform 118 into segments is accomplished by executing fault analysis application 110, and starts by an initialization step 300. Many things may be initialized at step 300. For example, a segment array 117 is initialized. Segment array 117 holds data representing the start points and end points of all of the segments that waveform 118 is divided into. Also at step 300, fault analysis application 110 determines what portion of waveform 118 is irrelevant to the analysis. In other words, there is a certain point on waveform 118 with a corresponding X-axis value, at which the analysis should stop. For example, an analysis of waveform 118 at locations corresponding to portions of cable 104 that are beyond an interface 136 (FIG. 1B) between cable 104 and TDR 102 are not relevant.

Further initialization includes setting a variable representing the number of segments collected to zero, setting a variable representing the number of undesirable slopes to zero, and setting an index for looping through segment array 117 to a certain number that represents the last position in segment array 117. This index is representative of the maximum number of times segment array 117 may be looped through. As an example, the user may set the index to 1,023. This means there are 1,024 points on waveform 118 that may potentially be analyzed; i.e., points 0 through 1023. In this example, point 1023 corresponds to point 138 as illustrated in FIG. 1B.

At decisional step 302, fault analysis application 110 determines if a relevant portion of waveform 118 is still being analyzed and if segment array 117 is open. If the answer is yes to both questions, then fault analysis application 110 determines if point 138 on waveform 118 having the maximum X-axis value is greater than zero at step 304. If point 138 on waveform 118 having the maximum X-axis value is greater than zero, then the method continues at step 306. At step 306, fault analysis application 110 determines whether a straight line, if drawn between the current point on waveform 118 being analyzed and the next adjacent point on waveform 118, would have a positive slope. If the answer is yes, then an end point of a segment is saved at step 308.

Fault analysis application 110 then again determines, at step 310, whether a relevant portion of waveform 118 is still being analyzed, and if segment array 117 is open. If the answer is yes, then fault analysis application 110 determines if the number of undesirable slopes between adjacent points is greater than the tolerable number of undesirable slopes within any particular segment at step 312. An undesirable slope is a slope between adjacent points on any particular segment that does not fall within the specified range that a user desires. In one embodiment, a user may determine that there is no tolerance for undesirable slopes; however, some users may determine that no more than five adjacent pairs of points with undesirable slopes are tolerable. The tolerable number of undesirable slopes may vary depending upon what type of noise a user expects to encounter in cable 104. In any event, if the number of undesirable slopes between adjacent points is greater than the tolerable number of undesirable slopes within a segment, then a start point of a segment is saved at step 314, resulting, in conjunction with the end point of the segment identified at step 308, in identification of a segment. Since a segment is now identified, the number of segments is incremented by one at step 316, and fault analysis application 110 proceeds to the next point on waveform 110 at step 318. The method then continues at step 302 as outlined above.

Referring back to decisional step 312, if the number of undesirable slopes between adjacent points is not greater than the tolerable number of undesirable slopes within a segment, then fault analysis application 110 determines again at step 320 whether point 138 on waveform 118 with the maximum X-axis value is greater than zero. If the answer is yes, then fault analysis application 110 determines at step 322 whether a straight line, if drawn between the current point being analyzed and the next adjacent point on waveform 118, would have a negative slope. If the answer is yes, then the number of undesirable slopes is incremented by one at step 324, and fault analysis application 110 proceeds to the next point on waveform 118 at step 326. The method then continues at decisional step 310 as outlined above.

Referring back to decisional step 322, if fault analysis application 110 determines that a straight line, if drawn between the current point being analyzed and the next adjacent point on waveform 118, would have not have a negative slope, then the number of undesirable slopes is set to zero at step 328, and the method continues at step 326 as outlined above.

Referring back to decisional step 306, if fault analysis application 110 determines that a straight line, if drawn between the current point being analyzed and the next adjacent point on waveform 118, would not have a positive slope, then fault analysis application 110 proceeds to the next point on waveform 118 at step 318 and the method continues at step 302 as outlined above. Similarly, referring back to decisional step 310, if a relevant portion of waveform 118 is not being analyzed or if segment array 117 is not open, than fault analysis application 110 proceeds to the next point on waveform 118 at step 318, and the method continues at step 302 as outlined above.

So far, the discussion of FIGS. 3A and 3B has proceeded assuming the result of step 304 is "yes," which indicates that point 138 on waveform 118 with the maximum X-axis value is greater than zero, which means that an open circuit condition exists in cable 104. If, however, point 138 on waveform 118 with the maximum X-axis value is not greater than zero, then a short circuit condition exists in cable 104. Therefore, the only differences between the method outlined above in conjunction with an open circuit condition and a short circuit condition is that decisional step 330 is substituted for decisional step 306, and decisional step 332 is substituted for decisional step 322. Consequently, fault analysis application 110 determines at step 330 whether a straight line, if drawn between the current point being analyzed and the next adjacent point on waveform 118, would have a negative slope. If the answer is yes, then the method continues at step 308 as outlined above. If the answer is no, then the method continues at step 318 as outlined above. In addition, fault analysis application 110 determines at step 332 whether a straight line, if drawn between the current point being analyzed and the next adjacent point on waveform 118, would have a positive slope. If the answer is yes, then the method continues at step 324 as outlined above, and if the answer is no, then the method continues at step 328 as outlined above.

Referring now back to decisional step 302, if a relevant portion of waveform 118 is not being analyzed or segment array 117 is not open, then fault analysis application 110 determines at step 334 if an interrupted segment exists. An interrupted segment refers to a segment that has an end point identified, but no start point identified, when either a relevant portion of waveform 118 is not being analyzed or if segment array 117 is full. If an interrupted segment exists, then the start point of the interrupted segment is saved at step 336, the number of segments is incremented by one at step 338, and waveform 118 is essentially finished being divided into segments. If an interrupted segment does not exist, then waveform 118 is essentially finished being divided into segments. Once waveform 118 is finished being divided into segments, then the analysis of waveform 118 continues with the method as described below in conjunction with FIG. 4.

FIG. 4 is a flowchart illustrating additional details of step 204 of identifying a predicted location of fault 106 in cable 104 in accordance with one embodiment of the present invention. After the method outlined in FIGS. 3A and 3B above is completed, and fault analysis application 110 determines longest segment 132 at step 202, then a fault point magnitude is determined at step 400. The fault point magnitude may be defined as the magnitude of the start point of longest segment 132 plus a predefined percentage of the difference of magnitudes between the start point and the end point of longest segment 132. In one embodiment, the predefined percentage of the difference of magnitudes between the start point and the end point of longest segment 132 is approximately ten percent. However, other predefined percentages may be used depending on what type of fault 106 is being analyzed, and what type of cable 104 is being tested.

Fault 106 is then located at a point on longest segment 132 that has magnitude approximately equal to the fault point magnitude at step 402. One way of determining the location of fault 106 at a point on longest segment 132 that has a magnitude approximately equal to the fault point magnitude is to re-sort segment array 117 in descending order so that longest segment 132 is the first segment in segment array 117. Then the magnitudes of all points that comprise longest segment 132 may be compared to the fault point magnitude to determine which point has a magnitude approximately equal to the fault point magnitude. In another embodiment, fault 106 is located approximately adjacent to the start point of longest segment 132.

Once fault 106 is located, then fault 106 may be classified as an open circuit or a short circuit at step 404, thereby ending the method of analyzing waveform 118 in accordance with one embodiment of the present invention.

As mentioned previously, fault analysis application 110 may be operable to place marker 134 (FIG. 1B), such as a cursor or cross, on waveform 118 to indicate the location of fault 106. Waveform 118 and coordinate system 126, along with the location and/or classification of fault 106, may then be printed out using printer 116 for distribution to the appropriate personnel.

Although embodiments of the invention and their advantages are described in detail, a person skilled in the art could make various alternations, additions, and omissions without departing from the spirit and scope of the present invention as defined by the appended claims.

What is claimed is:

1. A method for analyzing a fault in a cable, the method comprising:
dividing a waveform into a plurality of segments, the slope at any point on each respective segment falling within a respective specified range, the waveform representative of a reflected signal created by applying a stimulus signal to the cable;
determining a longest segment from the plurality of segments; and
identifying, based at least in part on the location of the longest segment, a predicted location of the fault.

2. The method of claim 1, further comprising coupling a time domain reflectometer to the cable, the time domain reflectometer operable to apply the stimulus signal, to receive the reflected signal, and to obtain the waveform representative of the reflected signal.

3. The method of claim 1, further comprising:
determining a sign of the slope; and
specifying, based on the sign, a classification of the fault, the classification selected from the group consisting of an open circuit and a short circuit.

4. The method of claim 1, further comprising;
determining whether a specified point on the waveform is positive or negative; and
specifying, based that determination, a classification selected from the group consisting of an open circuit and a short circuit.

5. The method of claim 1, wherein dividing a waveform into a plurality of segments comprises dividing the waveform having a plurality of coordinate points representative of the magnitude of the reflected signal and the location within the cable into a plurality of segments.

6. The method of claim 5, wherein dividing the waveform having a plurality of coordinate points comprises dividing the waveform having x-axis units selected from the group consisting of distance units and time units, and y-axis units selected from the group consisting of millivolts, ohms, and rhos into a plurality of segments.

7. The method of claim 1, wherein dividing a waveform into a plurality of segments comprises dividing the waveform into the plurality of segments, wherein the slope at any point on each respective segment is negative.

8. The method of claim 1, wherein dividing a waveform into a plurality of segments comprises dividing the waveform into the plurality of segments, wherein the slope at any point on each respective segment includes no more than five adjacent pairs of points with slopes falling outside the respective specified range.

9. The method of claim 5, wherein determining a longest segment from the plurality of segments comprises determining, from the plurality of segments, which segment has the largest change in magnitude of the reflected signal.

10. The method of claim 1, wherein dividing a waveform into a plurality of segments comprises dividing the waveform into the plurality of segments, wherein the slope at any point on each respective segment is positive.

11. The method of claim 1, wherein identifying a predicted location of the fault comprises:
calculating approximately ten percent of the absolute difference of magnitude between a start point and an end point of the longest segment;
adding the approximately ten percent to the magnitude at the start point of the longest segment to obtain a fault point magnitude; and
locating the fault near a point on the longest segment that has a magnitude approximately equal to the fault point magnitude.

12. The method of claim 1, wherein identifying a predicted location of the fault comprises placing a marker on the waveform to indicate the predicted location of the fault.

13. A method for analyzing a fault in a cable, the method comprising:
dividing a waveform having a plurality of coordinate points representative of a magnitude of a reflected signal and the location within the cable into a plurality of segments, the slope at any point on each respective segment falling within a respective specified range, the waveform representative of a reflected signal created by applying a stimulus signal to the cable;
determining, from the plurality of segments, a longest segment having the largest change in magnitude of the reflected signal; and identifying, based at least in part on the location of the longest segment, a predicted location of the fault.

14. The method of claim 13, further comprising coupling a time domain reflectometer to the cable, the time domain reflectometer operable to apply the stimulus signal, to receive the reflected signal, and to obtain the waveform representative of the reflected signal.

15. The method of claim 13, further comprising:

determining a sign of the slope; and specifying, based on the sign, a classification of the fault, the classification selected from the group consisting of an open circuit and a short circuit.

16. The method of claim 13, further comprising;

determining whether a specified point on the waveform is positive or negative; and specifying, based that determination, a classification selected from the group consisting of an open circuit and a short circuit.

17. The method of claim 13, wherein dividing the waveform having a plurality of coordinate points comprises dividing the waveform having x-axis units selected from the group consisting of distance units and time units, and y-axis units selected from the group consisting of millivolts, ohms, and rhos into a plurality of segments.

18. The method of claim 13, wherein dividing a waveform into a plurality of segments comprises dividing the waveform into the plurality of segments, wherein the slope at any point on each respective segment is positive.

19. The method of claim 13, wherein dividing a waveform into a plurality of segments comprises dividing the waveform into the plurality of segments, wherein the slope at any point on each respective segment is negative.

20. The method of claim 13, wherein dividing a waveform into a plurality of segments comprises dividing the waveform into the plurality of segments, wherein the slope at any point on each respective segment includes no more than five adjacent pairs of points with slopes falling outside the respective specified range.

21. The method of claim 13, wherein identifying a predicted location of the fault comprises:

calculating approximately ten percent of the absolute difference of magnitude between a start point and an end point of the longest segment;

adding the approximately ten percent to the magnitude at the start point of the longest segment to obtain a fault point magnitude; and locating the fault near a point on the longest segment that has a magnitude approximately equal to the fault point magnitude.

22. The method of claim 13, wherein identifying a predicted location of the fault comprises placing a marker on the waveform to indicate the predicted location of the fault.

23. Cable fault analysis application embodied in a computer readable medium and operable to perform the following steps:

divide a waveform into a plurality of segments, the slope at any point on each respective segment falling within a respective specified range, the waveform representative of a reflected signal created by applying a stimulus signal to the cable;

determine a longest segment from the plurality of segments; and identify, based at least in part on the location of the longest segment, a predicted location of the fault.

24. The cable fault analysis application of claim 23, further comprising a time domain reflectometer coupled to the cable, the time domain reflectometer operable to apply the stimulus signal, to receive the reflected signal, and to obtain the waveform representative of the reflected signal.

25. The cable fault analysis application of claim 23, further operable to:

determine a sign of the slope; and specify, based on the sign, a classification of the fault, the classification selected from the group consisting of an open circuit and a short circuit.

26. The cable fault analysis application of claim 23, further operable to;

determine whether a specified point on the waveform is positive or negative; and specify, based that determination, a classification selected from the group consisting of an open circuit and a short circuit.

27. The cable fault analysis application of claim 23, wherein the waveform comprises a plurality of coordinate points representative of the magnitude of the reflected signal and the location within the cable.

28. The cable fault analysis application of claim 27, wherein the plurality of coordinate points comprise x-axis units selected from the group consisting of distance units and time units, and y-axis units selected from the group consisting of millivolts, ohms, and rhos into a plurality of segments.

29. The cable fault analysis application of claim 23, wherein the slope at any point on each respective segment is negative.

30. The cable fault analysis application of claim 23, wherein the slope at any point on each respective segment includes no more than five adjacent pairs of points with slopes falling outside the respective specified range.

31. The cable fault analysis application of claim 27, further operable to determine, from the plurality of segments, which segment has the largest change in magnitude of the reflected signal.

32. The cable fault analysis application of claim 23, wherein the slope at any point on each respective segment is positive.

33. The cable fault analysis application of claim 23, further operable to:

calculate approximately ten percent of the absolute difference of magnitude between a start point and an end point of the longest segment;

add the approximately ten percent to the magnitude at the start point of the longest segment to obtain a fault point magnitude; and locate the fault near a point on the longest segment that has a magnitude approximately equal to the fault point magnitude.

34. The cable fault analysis application of claim 23, further operable to place a marker on the waveform to indicate the predicted location of the fault.

* * * * *